United States Patent [19]

Blaser

[11] Patent Number: 5,001,307

[45] Date of Patent: Mar. 19, 1991

[54] KEYBOARD

[75] Inventor: Paul Blaser, Villingen-Schwenningen, Fed. Rep. of Germany

[73] Assignee: Mannesmann Kienzle GmbH, Villingen, Fed. Rep. of Germany

[21] Appl. No.: 392,574

[22] Filed: Aug. 10, 1989

[30] Foreign Application Priority Data

Aug. 12, 1988 [DE] Fed. Rep. of Germany ....... 3827430

[51] Int. Cl.[5] ...................... H01H 9/00; H01H 13/70; H05K 1/18; B41J 5/10

[52] U.S. Cl. .................................. 200/5 A; 200/293; 235/145 R; 400/472

[58] Field of Search ............... 200/5 R, 5 A, 512-517, 200/293-296; 235/145 R; 361/331, 397, 399, 429; 400/472, 479, 489

[56] References Cited

U.S. PATENT DOCUMENTS

| | | | |
|---|---|---|---|
| 4,467,150 | 8/1984 | Leitermann et al. | 200/5 A |
| 4,524,249 | 6/1985 | Farrell | 200/5 A |
| 4,560,845 | 12/1985 | Takamura et al. | 200/5 A |
| 4,605,828 | 8/1986 | Gostomski, Jr. et al. | 200/5 A |
| 4,851,618 | 7/1989 | Amino et al. | 200/5 A |

*Primary Examiner*—J. R. Scott
*Attorney, Agent, or Firm*—Toren, McGeady & Associates

[57] ABSTRACT

A keyboard for large scale inexpensive production comprises a housing having a front frame and a base part which are connectable with one another by latch elements to support a printed circuit board in a floating manner. The printed circuit board carries the keys of the keyboard. The printed circuit board is assembled to the front frame with relatively great accuracy via several aligning elements.

13 Claims, 3 Drawing Sheets

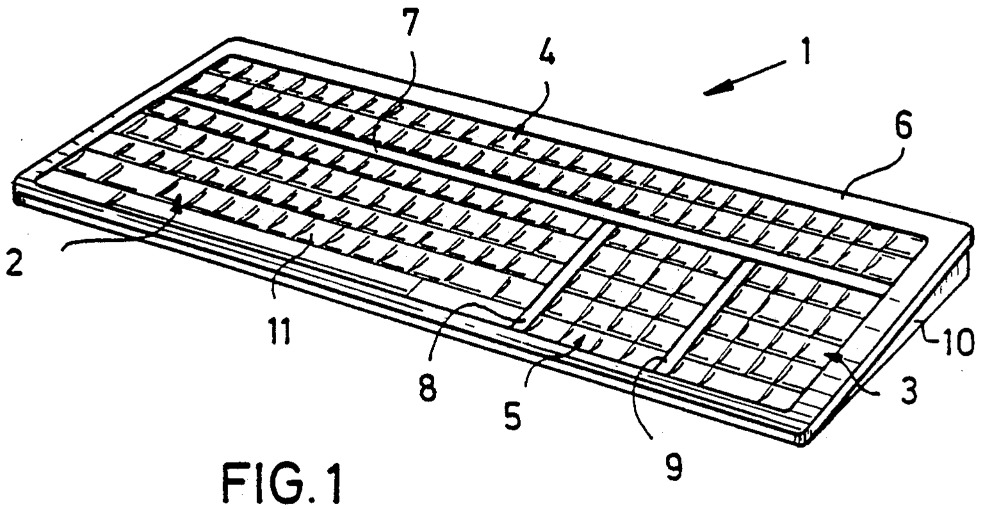
FIG. 1
FIG. 5
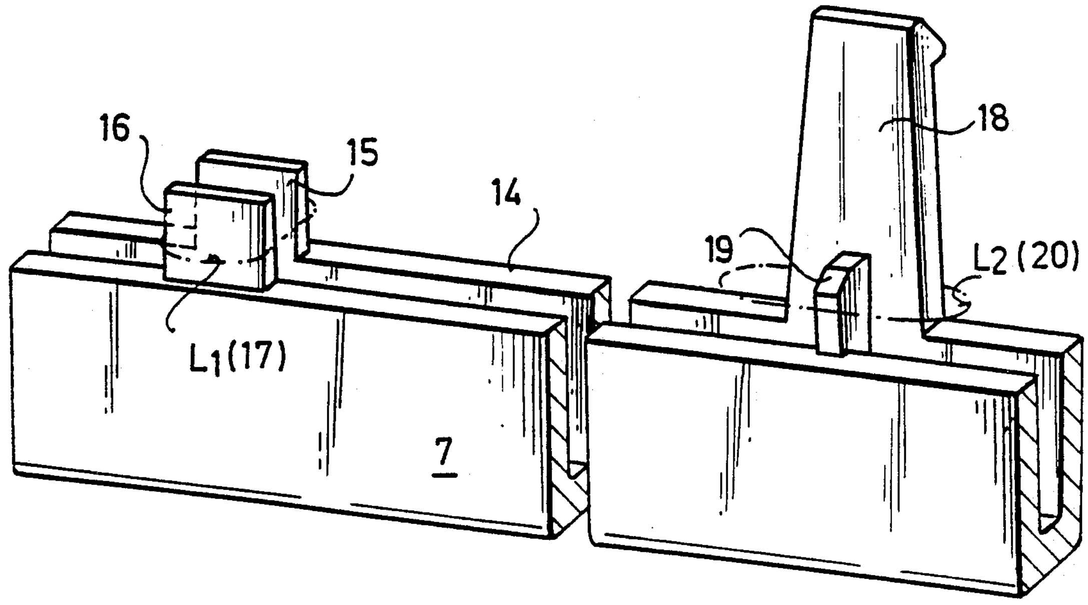

KEYBOARD

The invention is directed to a keyboard with a printed circuit board and which carries keys, and a housing therefor.

BACKGROUND OF THE INVENTION

It is expected of keyboards, particularly those which, as autonomous units, constitute an auxiliary component, so to speak, of data processing systems, that they function reliably, can be exchanged at any time and integrated in an existing device configuration and that they be inexpensive.

Such conditions compel a standardization of the keyboards with the goal of achieving high production numbers and providing the prerequisites for large-scale production and mechanical assembly with as few work steps as possible and structural component parts which are simple in terms of functional design.

However, as a rule, a reduction in the quantity of structural component parts and in costs in manufacturing and assembly and manufacturing tolerances, which allows largescale manufacturing, impairs the stability and accordingly also the operating reliability, particularly where parts which are relatively large in dimension and are produced by means of injection molding are involved.

In contrast with efforts toward economical manufacturing is the fact that a high quality must also be demanded with respect to the external appearance for use of such keyboards in office environments which have constant climatic conditions and where the risk of soiling is relatively low, in the teller window of banks and the like, and that, when used in the area of manufacturing, in filling stations, in storage spaces and on construction sites, where negative environmental influences predominate, the functions of the keyboards must be designed for conditions of use which are severe under certain circumstances and must not be destroyed by environmental influences.

Keyboards used in trade generally correspond to the demands for quality in aesthetic and functional respects in the office environment. Under more severe conditions of use and operation, these keyboards are often unsatisfactory as a result of temperature-dependent expansions. These are essentially caused by the classical construction of the keyboards with a plurality of structural component parts which are screwed together. To this extent, the construction of the known keyboards can also not meet the requirements of a large-scale production with subsequent mechanical assembly.

SUMMARY OF THE INVENTION

The object of the present invention accordingly consists in optimizing the construction of keyboards in such a way that it meets the requirements with respect to economical manufacturing on the one hand and the different conditions of use of the keyboards on the other hand.

To achieve this and other objects, the invention provides a housing comprising a front frame and a base part, having latch or locking elements, which cooperate with one another, formed at the front frame and the base part, with the front frame and base part constructed in such a way that the assembly of the front frame with the base part and the engagement or interlocking of the latch elements holds an intermediately located printed circuit board so as to be substantially free of play.

The advantages of the invention, which have been found also for alphanumeric keyboards with considerable dimensions, consists in that the keyboard comprises only a front frame, a base part and a preassembled component, namely a printed circuit board which is directly equipped with keys, and these structural component parts are connected with one another exclusively by means of the latch connections. In so doing, the printed circuit board is held between the front frame and base part in a floating manner, so to speak, when the latter are locked with one another, i.e. the housing formed from the front frame and base part can expand, e.g. because of temperature, relative to the printed circuit board without stresses occurring in the printed circuit board because of such expansion. In other words, the printed circuit board is not, itself, directly fastened to the front frame or base part. Moreover, with the construction according to the invention, vertical tolerance additions relative to the key plane are reduced and the manufacturing tolerances in the key plane, which must be designed in a relatively rough manner when the housing structural component parts are produced by means of injection molding, have no influence to a great extent with respect to the assembly of the keyboard.

This effect is achieved in that an aligning element is formed on or at a central location of the front frame, e.g. at a rib or web dividing the keyboard into individual key fields, which aligning element cooperates with an opening in the printed circuit board and provides a relatively exact central fixing of the two structural component parts at least in the direction of the maximum dimension of the keyboard. This requires that relatively exacting tolerances are provided for this connection. At least one additional aligning element constructed at the front frame and an additional opening in the printed circuit board, which opening cooperates with the additional aligning element, are provided in order to form a safeguard against twisting, so to speak, between the front frame and printed circuit board and in order to form a fixing of the parts in a second dimension, wherein the additional opening is constructed as an elongated hole in order to enable expansions relative to the central fixing.

The amount of expansion of the housing structural component parts is halved by means of the central fixing and the provided degrees of freedom. Changes in the gap widths between the dividing ribs or webs of the front frame and the rows of key heads, which changes are caused by tolerances and temperature, are less visible or not at all noticeable, as a result of these steps. On the other hand, the ability of the housing structural component parts to expand relative to one another and relative to the printed circuit board and the adaptability to dimensions changing within the given rough tolerances, prevent operating disturbances.

In addition, it is advantageous that an alignment of the front frame and base part be effected, so to speak, along only one line, specifically along the greatest dimension of the keyboard, so that the reliable engagement of the latch elements which are effective on this line in particular is ensured. Another advantage of the invention is that the alignment elements and latch elements are constructed in such a way that both can be associated with one and the same opening in the printed circuit board. Otherwise, the front frame is constructed in such a way that it overlaps the rim of the base part on all sides at a certain distance, the base part being constructed in the manner of a trough. In the same way, sufficient lateral free space is also associated with every latch connection. It is noted, in addition, that the front frame and base part are constructed as relatively simple parts so that the costs of molding is small.

The preconditions for a particularly uncomplicated and preferably mechanical assembly are accordingly provided, in which the front frame is held by means of a suitable jig or receptacle, the printed circuit board provided with the keys is supplied, placed on the front frame and brought into engagement with the aligning elements, and the base part is subsequently locked with the front frame.

SUMMARY OF DRAWINGS

The invention is now explained in more detail with the aid of the attached drawings which show an exemplary embodiment of a keyboard constructed according to the invention, wherein:

FIG. 1 is a perspective overall view of the keyboard;

FIG. 5 is a perspective partial view of the aligning and latch elements constructed at a web of the front frame of the keyboard.

DETAILED DESCRIPTION OF PREFERRED EMBODIMENT

The perspective overall view of FIG. 1 shows an alphanumeric keyboard 1 with letter, number, function and so-called cursor key fields 2, 3, 4 and 5, respectively. Webs or ribs 7, 8 and 9 are formed on or at a front frame 6 and delimit the individual key fields 2, 3, 4 and 5 relative to one another. A base part which, together with the front frame 6, forms the housing of the keyboard 1 is designated by 10.

Figure 2:
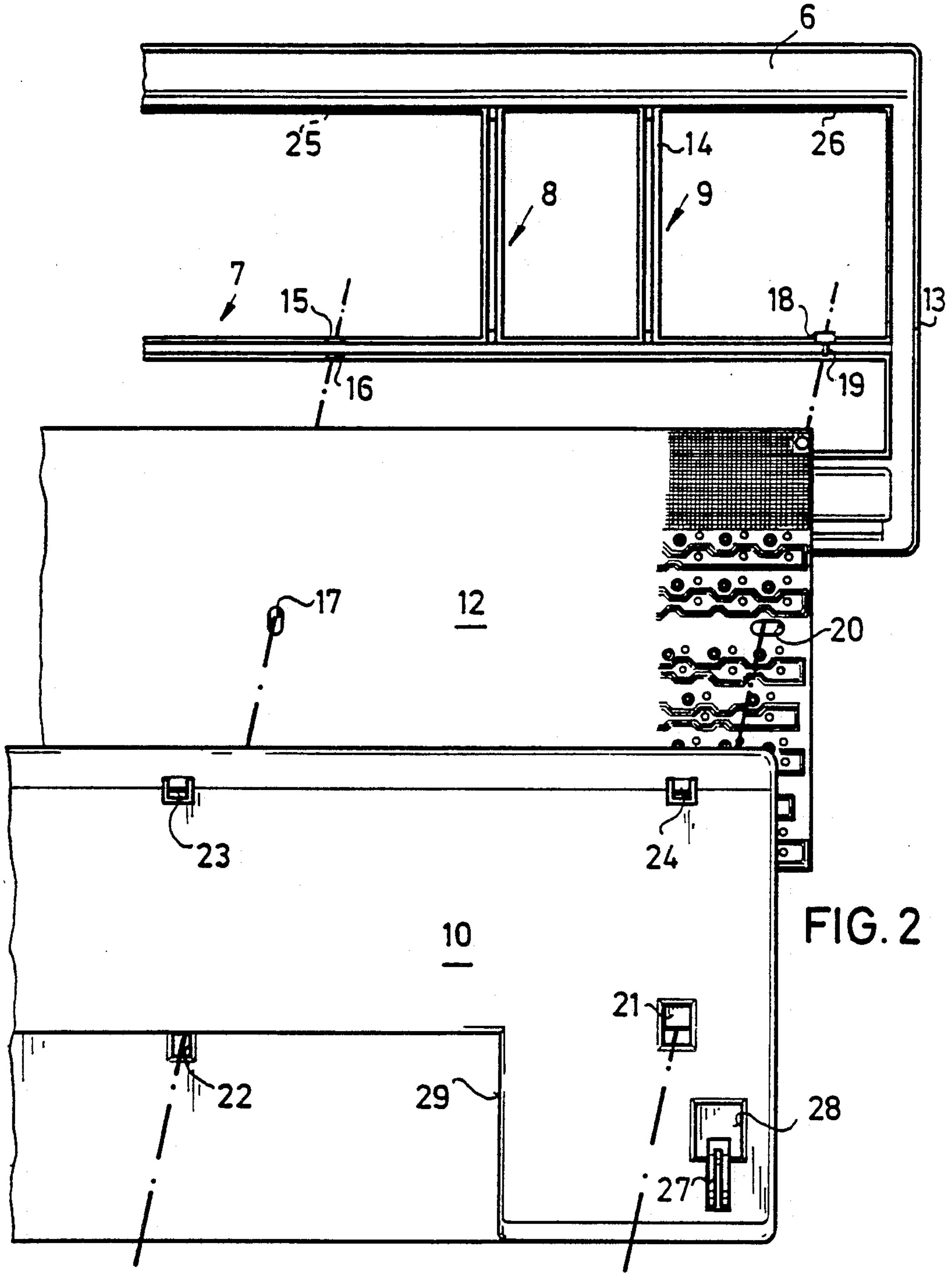
FIG. 2 is an exploded view, staggered in perspective, of bottom views of the structural component parts of the keyboard which are assembled corresponding to the assembly sequence.

In a perspective staggered or exploded arrangement, FIG. 2 shows the rear and bottom views of the structural component parts forming the keyboard 1, namely the front frame 6, the base part 10 shaped in a trough-like manner, and a printed circuit board 12 carrying the keys, one of which is designated by 11 in FIG. 1. For the sake of completeness, it is noted that conductor paths, not designated in more detail, are applied to the printed circuit board 12, which conductor paths intersect on both sides and, together with a bore hole in the printed circuit board in each instance, form inductance coils at the intersecting points. That is, the signaling is effected inductively in the chosen embodiment example. The invention is not limited to this specific technology.

For reasons relating to some extent to injection molding techniques, the individual sides of the front frame 6, which are not designated in more detail, and the webs 7, 8 and 9 have a U-shaped profile, as can be seen from FIG. 2, so that a circumferentially extending outer wall 13 and inner wall parts, one of which is designated by 14, are formed. The inner wall parts 14 of the webs 7, 8 and 9 and the side of the front frame 6 form the support for the printed circuit board 12. The end faces of the wall parts 14 are preferably formed so as not to lie in one and the same plane and a point support or limited line support of the printed circuit board 12 is accordingly achieved.

In a substantially central area of the front frame 6, tongues 15 and 16, which constitute aligning elements, are formed at the web 7. When the printed circuit board 12 is placed on the frame 6, these tongues 15 and 16 engage through an elongated opening 17 located in the printed circuit board 12 and effect an exact mutual positioning of the printed circuit board 12 and front frame 6 with respect to the larger dimension or longitudinal direction of the keyboard 1. Together with a rib 19 which is constructed transversely relative to the web 7, a latch hook 18, which is likewise formed on or at the web 7, forms an additional aligning element which, together with an elongated hole 20 provided in the printed circuit board 12 through which latch 18 passes, effects an exact fixing of the front frame 6 and printed circuit board 12 exclusively in the shorter dimension of the keyboard 1. Since the opening 17 is likewise constructed as an elongated hole, specifically in the direction of the short dimension, additional aligning and latch elements and an elongated hole corresponding to the aligning and latch elements 18, 19 and the elongated hole 20 can be provided, preferably so as to be symmetrical relative to the opening 17. In other words, additional elements similar to elements 18, 19, and 20 (not shown in FIG. 2) can be provided on ribs 7 but on the opposite side relative to opening 17. The smaller horizontal width of hole 17, cooperating with tongues 15, 16 fix the board position in the long dimension (horizontal in FIG. 2), whereas the 90 degree rotated smaller vertical height of hole 20 fixes the board position in the shorter dimension (vertical in FIG. 2). Yet, that same hole 20 orientation permits play in the long dimension. The construction of the aligning and latch elements can be seen in detail more clearly from FIG. 5. The rib 19 connects the walls 14 of the web 7, as shown by FIG. 5, and accordingly serves additionally as stabilization. The lines L1 and L2, which are drawn in dash-dot lines, symbolize the position of the bottom edge of the right angle oriented elongated holes 17 and 20 in the printed circuit board 12 when the latter is positioned on the respective front frame.

Cavities 21, in which the latch hooks 18 engage, are formed in the base part 10. The opening 22 is for the tongues 15 and 16, so that a mutual positioning of the base part 10 and the front frame 6 is effected on a line predetermined by means of the central web 7, since the aligning elements 18, 19 are constructed in such a way that they also engage in the pockets, 21., Two or three latch elements 23, 24 are formed on or at the base part 10 and engage with openings 25 and 26 in the wall parts 14 of the front frame 6 when the housing is assembled. By so doing, sufficient lateral free space is provided for all the latch connections in the longitudinal direction (horizontal) of the keyboard 1. For the sake of completeness, it is noted that supports 27, with which a recessed grip 28 is associated in each instance, are swivelably supported in the base part 10 and serve to adjust the inclination of the keyboard 1 in use. In addition, a bulge 29 is formed in the base part 10; added units can, if necessary, be assigned to the keyboard 1 via this bulge 29.

Figure 3:
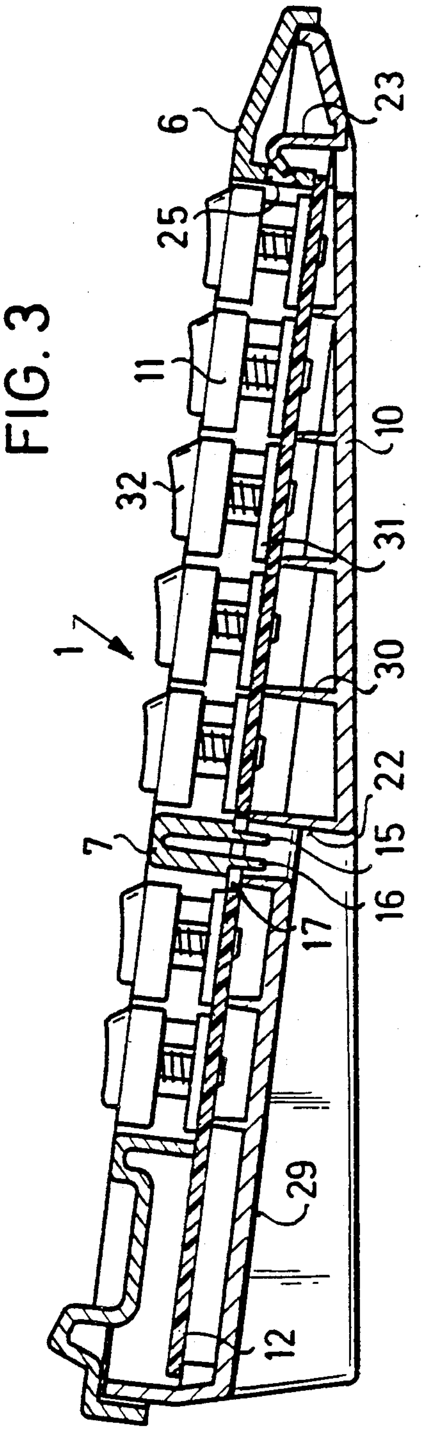
FIG. 3 is a cross-sectional view of the keyboard.

It can be seen from the sectional view of FIG. 3 that ribs 30, upon which the printed circuit board 12 lies when the housing structural component parts 6, 10 are locked together, are constructed in the base part 10, and that the printed circuit board 12 is secured and supported only between the wall parts 14 of the front frame 6 and the ribs 30. In addition, FIG. 3 shows that the front frame 6 engages around the trough-shaped base part 10 so as to be at a distance on all sides. The keys 11 are fastened directly on the printed circuit board 12, i.e. the respective key base 31 is locked with the printed circuit board 12, for example, and the key head 32 is supported in a resilient, spring-mounted manner on the key base by means of suitable column guiding in a manner known per se.

Figure 4:
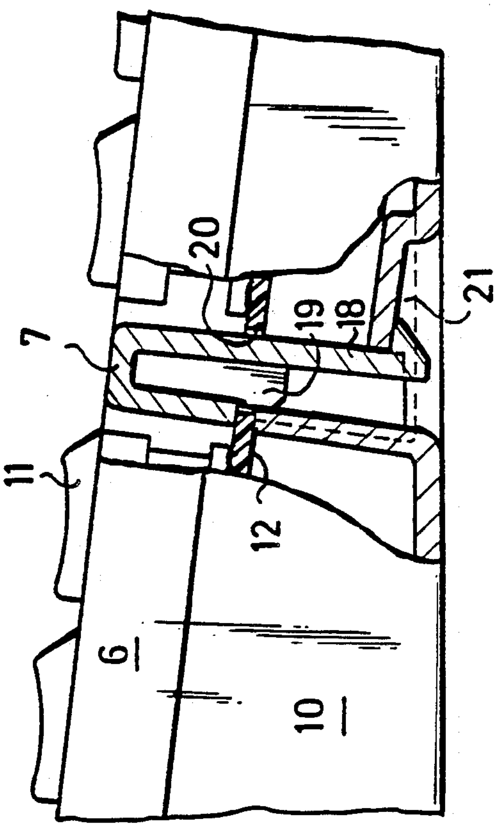
FIG. 4 is a partial section of the keyboard in the area of a latch connection.

The sectional view of FIG. 4 clearly shows the integrated manner of construction of the aligning and latch elements 18, 19 which are constructed at the web 7 and engage the opening 20 in the printed circuit board 12 and the pocket 21 in the base part 10. As will be evident, during assembly, when the base 10 is placed over the assembled front frame 6 and board 12, pressing of the base 10 causes the latches 18, 23, and 24 to engage, respectively, the cavities 21, and the holes 25 and 26 and the latch hook ends lock the assembly together. Note that the hooks of the respective latches 18, and 23, 24 face in opposite directions. While only one latch 18, 19 is shown in FIG. 2, it will be understood that additional latches of the same type can be provided along the central rib 7. The assembly is readily disassembled by pushing back the hook ends of latches 18, 23, and 24 to release them.

While the invention has been described in connection with preferred embodiments, it will be understood that modifications thereof within the principles outlined above will be evident to those skilled in the art and thus the invention is not limited to the preferred embodiments but is intended to encompass such modifications.

We claim:

1. A keyboard comprising a base part, an overlying front frame part, and a separate printed circuit board having openings and having actuable keys mounted thereon and positioned between the base and the frame, and a plurality of spaced latch means for clamping and retaining the printed circuit board in operating position between the base and frame, each of said latch means comprising a member connected to one of the base and fame and passing through a printed circuit board opening and latched to the other of the base and frame, said latch means being the sole means for retaining the printed circuit board between said base and frame.

2. The keyboard of claim 1, wherein said front frame comprises aligning elements, said printed circuit board having openings for receiving and cooperating with the aligning elements.

3. The keyboard of claim 2, wherein one of said cooperating openings is oval shaped with a narrow dimension parallel to the longitudinal dimension of the keyboard.

4. The keyboard of claim 3, wherein two of said cooperating openings are oval shaped and oriented 90° with respect to one another.

5. The keyboard of claim 1, wherein the base part is shaped in the manner of a trough with a rim, the front frame overlaps the rim of the base part so as to extend on all sides beyond the rim.

6. The keyboard of claim 1, wherein said frame comprises webs which divide the keyboard into key fields, and the latch means are provided on the webs.

7. The keyboard according to claim 1, wherein the latch means have hook ends, one of said latch means is connected to the base part and another of the latch means is connected to the frame part, the latch hook ends on the base and frame parts facing in opposite directions.

8. The keyboard according to claim 3, wherein said frame comprises webs which divide the keyboards into key fields, and the latch means are provided on the webs, and one of said latch means is configured to serve also as one of said aligning elements for the printed circuit board.

9. The keyboard according to claim 1, wherein the base part comprises ribs, and the front frame comprises facing wall parts, and the printed circuit board is held between said ribs and said facing wall parts.

10. A keyboard as claimed in claim 1, wherein the printed circuit board has first and second main dimensions, further comprising means for substantially preventing lateral movement of the printed circuit board along at least one of its main dimensions, said last-named means comprising a member on one of the base and frame and engaging with a slight clearance the walls of an opening in the printed circuit board.

11. A keyboard as claimed in claim 10, further comprising means for substantially preventing lateral movement of the printed circuit board along the other of its main dimensions, said last-named means comprising a member on one of the base and frame and engaging with a slight clearance of an opening the walls in the printed circuit board.

12. A keyboard as claimed in claim 10, wherein said last-named means comprise alignment lugs on the frame engaging elongated openings in the printed circuit board.

13. A keyboard as claimed in claim 1, wherein said latch means member is molded integral with the base or frame to which it is connected.

* * * * *